(12) United States Patent
Kaneda et al.

(10) Patent No.: US 10,218,334 B2
(45) Date of Patent: Feb. 26, 2019

(54) ACOUSTIC WAVE DEVICE

(71) Applicant: TAIYO YUDEN CO., LTD., Tokyo (JP)

(72) Inventors: Yasufumi Kaneda, Tokyo (JP); Takuma Kuroyanagi, Tokyo (JP); Kazushige Hatakeyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 102 days.

(21) Appl. No.: 14/971,567

(22) Filed: Dec. 16, 2015

(65) Prior Publication Data
US 2016/0277006 A1    Sep. 22, 2016

(30) Foreign Application Priority Data

Mar. 18, 2015  (JP) ................................. 2015-055403
Aug. 7, 2015   (JP) ................................. 2015-157577

(51) Int. Cl.
| | | |
|---|---|---|
| *H03H 9/56* | (2006.01) | |
| *H03H 9/60* | (2006.01) | |
| *H03H 9/64* | (2006.01) | |
| *H03H 9/02* | (2006.01) | |

(52) U.S. Cl.
CPC ...... *H03H 9/6483* (2013.01); *H03H 9/02992* (2013.01); *H03H 9/568* (2013.01); *H03H 9/605* (2013.01); *H03H 9/02952* (2013.01)

(58) Field of Classification Search
CPC ........... H03H 9/02952; H03H 9/02992; H03H 9/0547; H03H 9/542; H03H 9/64; H03H 9/6423; H03H 9/6483; H03H 9/6489; H03H 9/568; H03H 9/605

USPC ......................................... 333/193–195, 189
See application file for complete search history.

(56) References Cited

U.S. PATENT DOCUMENTS

| | | | | |
|---|---|---|---|---|
| 5,914,646 A | * | 6/1999 | Hashimoto | .......... H03H 9/1071 310/313 D |
| 6,023,204 A | * | 2/2000 | Ikata | .................... H03H 9/1071 310/313 B |
| 6,060,381 A | | 5/2000 | Nakagawara et al. | |
| 6,081,171 A | * | 6/2000 | Ella | ...................... H03H 9/0095 310/348 |

(Continued)

FOREIGN PATENT DOCUMENTS

| | | |
|---|---|---|
| JP | 7-321425 A | 12/1995 |
| JP | H10-200370 A | 7/1998 |

(Continued)

OTHER PUBLICATIONS

Japanese Office Action dated Mar. 6, 2018, in a counterpart Japanese patent application No. 2015-157577. (A machine translation (not reviewed for accuracy) attached.).

(Continued)

*Primary Examiner* — Barbara Summons
(74) *Attorney, Agent, or Firm* — Chen Yoshimura LLP

(57) ABSTRACT

An acoustic wave device includes: a substrate; an acoustic wave resonator that is formed on the substrate; a first wiring line that is formed on the substrate and is electrically coupled to the acoustic wave resonator; and a second wiring line that is electrically coupled to the first wiring line, at least a part of the second wiring line being formed immediately above the acoustic wave resonator across an air gap.

11 Claims, 10 Drawing Sheets

(56) References Cited

U.S. PATENT DOCUMENTS

| | | | | |
|---|---|---|---|---|
| 6,150,904 | A * | 11/2000 | Taniguchi | H03H 9/6483 |
| | | | | 310/313 B |
| 7,750,420 | B2 * | 7/2010 | Field | H03H 3/0073 |
| | | | | 257/414 |
| 2002/0140519 | A1 | 10/2002 | Takayama et al. | |
| 2005/0151602 | A1 | 7/2005 | Hattanda et al. | |
| 2005/0214974 | A1 | 9/2005 | Field et al. | |
| 2010/0091473 | A1 * | 4/2010 | Kiwitt | H01G 4/40 |
| | | | | 361/782 |
| 2013/0062995 | A1 | 3/2013 | Matsuda et al. | |
| 2013/0099628 | A1 | 4/2013 | Inoue et al. | |
| 2016/0014902 | A1 | 1/2016 | Henn et al. | |

FOREIGN PATENT DOCUMENTS

| | | |
|---|---|---|
| JP | 2001-285025 A | 10/2001 |
| JP | 2004-112277 A | 4/2004 |
| JP | 2005-203889 A | 7/2005 |
| JP | 2012-9989 A | 1/2012 |
| JP | 2012-070098 A | 4/2012 |
| JP | 2012-80016 A | 4/2012 |
| JP | 2013-058911 A | 3/2013 |
| JP | 2016-510959 A | 4/2016 |
| WO | 2005/050836 A1 | 6/2005 |
| WO | 2014/135311 A1 | 9/2014 |

OTHER PUBLICATIONS

Japanese Office Action dated Sep. 25, 2018, in a counterpart Japanese patent application No. 2015-157577. (A machine translation (not reviewed for accuracy) attached.).

* cited by examiner

Comparative Example

Comparative Example

ACOUSTIC WAVE DEVICE

CROSS-REFERENCE TO RELATED APPLICATION

This application is based upon and claims the benefit of priority of the prior Japanese Patent Application No. 2015-055403, filed on Mar. 18, 2015, and the prior Japanese Patent Application No. 2015-157577, filed on Aug. 7, 2015, the entire contents of which are incorporated herein by reference.

FIELD

A certain aspect of the present invention relates to an acoustic wave device.

BACKGROUND

Acoustic wave devices are used in filters for mobile communications. There has been known an art that forms wiring lines that interconnect acoustic wave resonators formed on a substrate or connect the acoustic wave resonator to an external terminal so that the wiring lines intersect each other across an air gap as disclosed in Japanese Patent Application Publication No. 2012-9989. There has been known an art that forms an inductor above a substrate across an air gap as disclosed in Japanese Patent Application Publication Nos. 7-321425 and 2012-80016. There has been known an art that connects an inductor to a filter using an acoustic wave resonator as disclosed in Japanese Patent Application Publication Nos. 2001-285025 and 2004-112277.

To reduce the size of the acoustic wave device, the distance between the wiring lines interconnecting the acoustic wave resonators needs to be reduced. However, when the distance between the wiring lines interconnecting the acoustic wave resonators is reduced, the capacitance between the wiring lines increases. Thus, the downsizing of the acoustic wave device is not easy.

SUMMARY OF THE INVENTION

According to an aspect of the present invention, there is provided an acoustic wave device including: a substrate; an acoustic wave resonator that is formed on the substrate; a first wiring line that is formed on the substrate and is electrically coupled to the acoustic wave resonator; and a second wiring line that is electrically coupled to the first wiring line, at least a part of the second wiring line being formed immediately above the acoustic wave resonator across an air gap.

According to another aspect of the present invention, there is provided an acoustic wave device including: a substrate; acoustic wave resonators that are formed to be arranged in a first direction on the substrate; a first wiring line that is formed between the acoustic wave resonators on the substrate, and connects adjacent acoustic wave resonators of the acoustic wave resonators; and a second wiring line that is formed immediately above at least one of at least one of the acoustic wave resonators and the first wiring line across an air gap so as to connect both sides outside the acoustic wave resonators in a second direction intersecting the first direction.

DETAILED DESCRIPTION

Figure 1A:
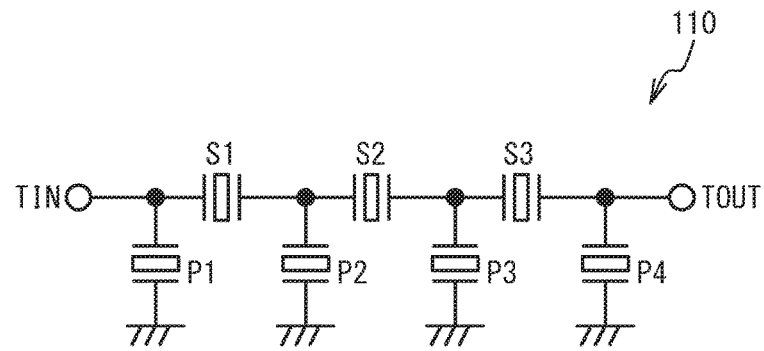
FIG. 1A is a circuit diagram of an acoustic wave device in accordance with a comparative example.
Figure 1B:
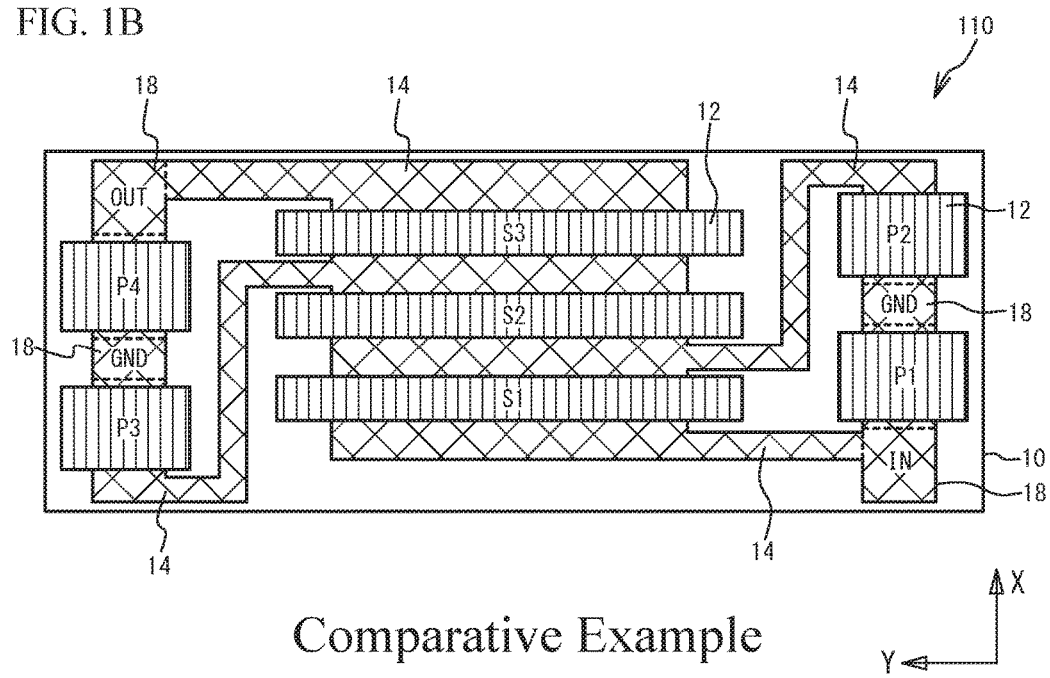
FIG. 1B is a plan view of the acoustic wave device in accordance with the comparative example.

A description will first be given of a comparative example. FIG. 1A is a circuit diagram of an acoustic wave device in accordance with the comparative example. As illustrated in FIG. 1A, in an acoustic wave device 110, series acoustic wave resonators S1 through S3 are connected in series between an input terminal TIN and an output terminal TOUT. Parallel acoustic wave resonators P1 through P4 are connected in parallel between the input terminal TIN and the output terminal TOUT. FIG. 1B is a plan view of the acoustic wave device in accordance with the comparative example. As illustrated in FIG. 1B, the acoustic wave device 110 includes acoustic wave resonators 12 formed on a substrate 10. The acoustic wave resonators 12 are the series acoustic wave resonators S1 through S3 and the parallel acoustic wave resonators P1 through P4 of a ladder-type filter. On the substrate 10, formed are first wiring lines 14 and pad electrodes 18. The pad electrodes 18 form an input electrode IN, an output electrode OUT, and ground electrodes GND. The first wiring line 14 electrically interconnects the acoustic wave resonators 12. Additionally, the first wiring line 14 electrically connects the acoustic wave resonator 12 and the pad electrode 18. The series acoustic wave resonators S1 through S3 are connected in series through the first wiring lines 14 between the input electrode IN and the output electrode OUT. The series acoustic wave resonators S1 through S3 are arranged in the X direction on the upper surface of the substrate 10. The parallel acoustic wave resonators P1 through P4 are connected in parallel through the first wiring lines 14 between the input electrode IN and the output electrode OUT. The parallel acoustic wave resonators P1 through P4 are formed outside the series acoustic wave resonators S1 through S3 in the ±Y direction, i.e., in the horizontal direction in FIG. 1B.

In the comparative example, when the distance between the first wiring line 14 and an adjacent conductor (for example, the acoustic wave resonators S1 through S3, P1 through P4, and the pad electrode 18) is reduced, the acoustic wave device can be reduced in size. However, the parasitic capacitance increases. Especially when the first wiring line 14 and the adjacent conductor have different electric potentials, the parasitic capacitance increases, and the characteristics of the acoustic wave device degrade. Thus, the downsizing of the acoustic wave device is difficult.

First Embodiment

Figure 2A:
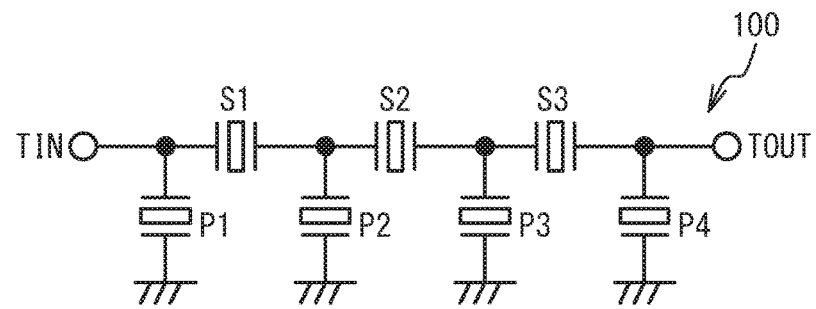
FIG. 2A is a circuit diagram of an acoustic wave device in accordance with a first embodiment.
Figure 2B:
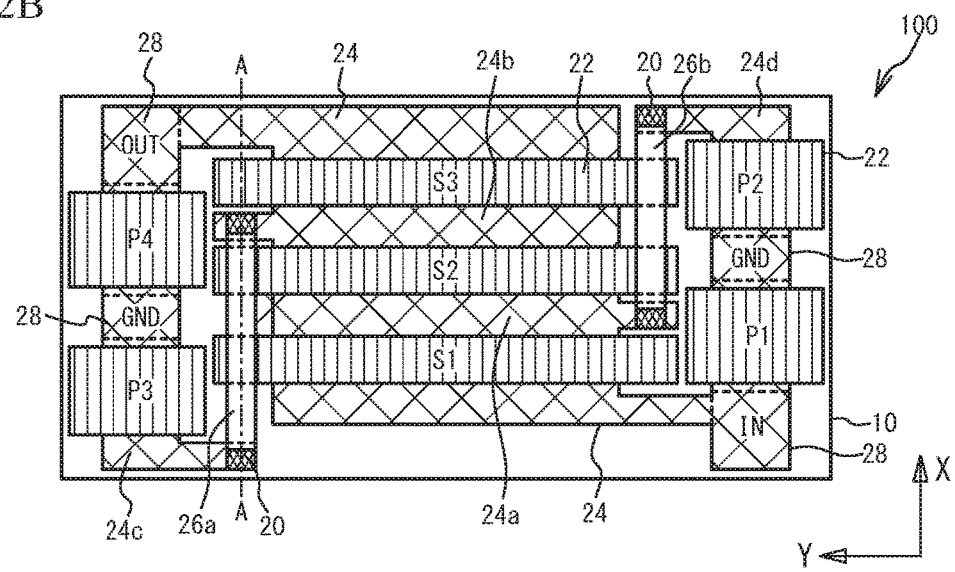
FIG. 2B is a plan view of the acoustic wave device of the first embodiment.
Figure 2C:
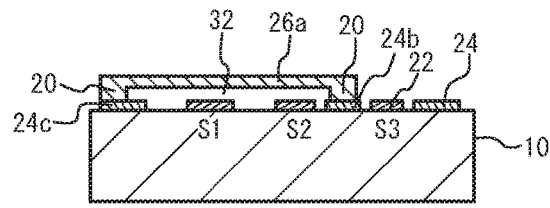
FIG. 2C is a cross-sectional view taken along line A-A in FIG. 2B.

FIG. 2A is a circuit diagram of an acoustic wave device in accordance with a first embodiment. As illustrated in FIG. 2A, the circuit of an acoustic wave device 100 of the first embodiment is the same as that of the comparative example. FIG. 2B is a plan view of the acoustic wave device of the first embodiment, and FIG. 2C is a cross-sectional view taken along line A-A in FIG. 2B. As illustrated in FIG. 2B and FIG. 2C, the acoustic wave device 100 includes acoustic wave resonators 22 formed on the substrate 10 as acoustic wave elements. The substrate 10 is, for example, a piezoelectric substrate such as a lithium tantalate substrate (e.g., a 36° to 48° Y-cut X-propagation substrate) or a lithium niobate substrate. The acoustic wave resonator 22 is, for example, a surface acoustic wave element. On the substrate 10, formed are first wiring lines 24 and pad electrodes 28. The first wiring line 24 and the pad electrode 28 are formed of a metal layer such as, for example, an aluminum layer. Second wiring lines 26a and 26b are located above the acoustic wave resonators 22 and the first wiring line 24 across an air gap 32. The second wiring line 26a connects a first wiring line 24b between the series acoustic wave resonators S2 and S3 to a first wiring line 24c connected to the parallel acoustic wave resonator P3. The second wiring line 26b connects a first wiring line 24a between the series acoustic wave resonators S1 and S2 to a first wiring line 24d connected to the parallel acoustic wave resonator P2. The second wiring lines 26a and 26b are connected to the first wiring lines 24 by supporting posts 20 at both ends thereof. The second wiring line 26 and the supporting post 20 are formed of a metal layer such as, for example, a copper layer. Other configurations are the same as those of the comparative example, and thus the description thereof is omitted.

Figure 2D:
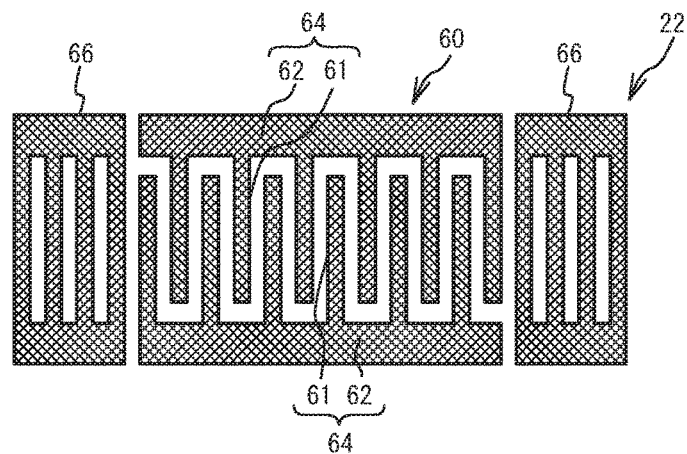
FIG. 2D is a plan view of an acoustic wave resonator.

FIG. 2D is a plan view of an acoustic wave resonator. The acoustic wave resonator 22 includes an IDT (Interdigital Transducer) 60 and reflectors 66. The reflectors 66 are formed at both sides of the IDT 60 in the propagation direction of the acoustic wave. The IDT 60 includes a pair of comb-shaped electrodes 64 facing each other. The comb-shaped electrode 64 includes electrode fingers 61 and a bus bar 62. The electrode fingers 61 are connected to the bus bar 62. The first wiring line 24 is connected to the bus bar 62.

In the first embodiment, at least a part of the second wiring line 26a and at least a part of the second wiring line 26b are formed immediately above the acoustic wave resonator 22 across the air gap 32. Since the air gaps 32 are located between the second wiring lines 26a and 26b and the acoustic wave resonator 22 and between the second wiring lines 26a and 26b and the first wiring line 24, the parasitic capacitances between the second wiring lines 26a and 26b and the acoustic wave resonator 22 and the parasitic capacitances between the second wiring lines 26a and 26b and the first wiring lines 24a and 24b can be reduced. Moreover, the second wiring lines 26a and 26b are formed above the series acoustic wave resonators S1 through S3. Thus, the wiring region in the Y direction can be reduced compared to that of the comparative example, and the size of the acoustic wave device can be reduced.

Moreover, the first wiring lines 24a and 24b are formed between two of the series acoustic wave resonators S1 through S3. The first wiring lines 24a electrically connects the adjacent series acoustic wave resonators S1 and S2. The first wiring line 24b electrically connects the series acoustic wave resonators S2 and S3. The second wiring lines 26a and 26b are connected to at least one first wiring line 24 of the first wiring lines 24a and 24b. The second wiring lines 26a and 26b are formed immediately above at least one series acoustic wave resonator of the series acoustic wave resonators S1 through S3 across the air gap 32. For example, the second wiring line 26a connects to the first wiring line 24b, and is formed immediately above the series acoustic wave resonators S1 and S2 across the air gap 32. In such an arrangement, the first wiring line 14, which occupies a region on the substrate 10 in the comparative example (see FIG. 1B), is formed above the series acoustic wave resonators S1 and S2. Thus, the size of the acoustic wave device including the series acoustic wave resonators S1 through S3 connected in series can be reduced. The series acoustic wave resonators S1 through S3 are used as examples of acoustic wave resonators, but the second wiring lines 26a and 26b may not be formed immediately above the series acoustic wave resonators S1 through S3, and may be formed immediately above the parallel acoustic wave resonators P1 through P4, other first wiring lines 24, and/or the pad electrode 28 across the air gap 32.

One or more parallel acoustic wave resonators P1 through P4 are formed outside the series acoustic wave resonators S1 through S3 in the Y direction (the direction intersecting the X direction). The second wiring lines 26a and 26b connect the first wiring line 24a or 24b to at least one of the parallel acoustic wave resonators P1 through P4. For example, the second wiring line 26a connects the first wiring line 24b to the first wiring line 24c connected to the parallel acoustic wave resonator P3. In such an arrangement, the second wiring lines 26a and 26b are formed immediately above the series acoustic wave resonators S1 through S3. Thus, the wiring region can be reduced, and the size of the acoustic wave device including a ladder-type filter can be reduced.

Figure 3:
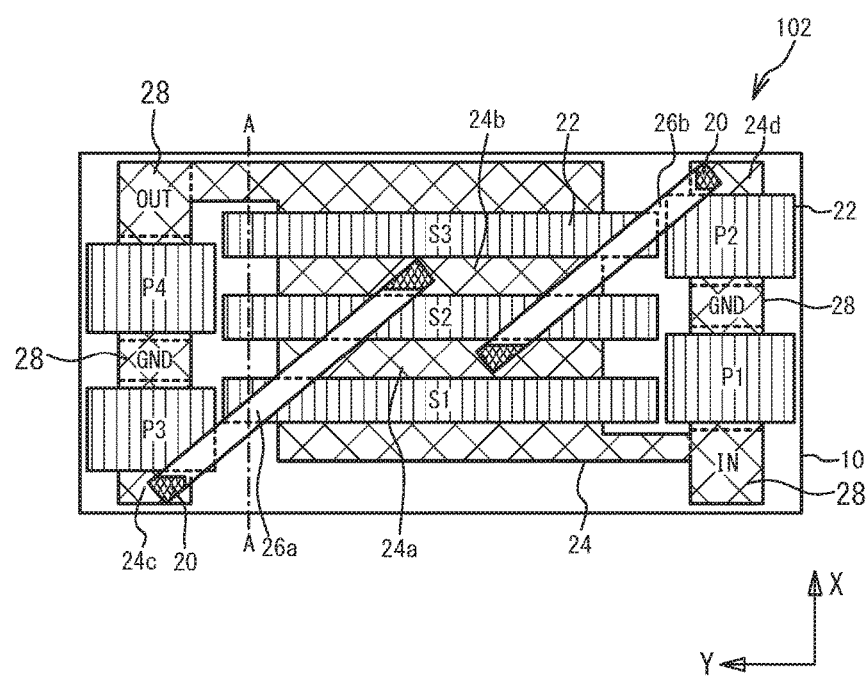
FIG. 3 is a plan view of an acoustic wave device in accordance with a variation of the first embodiment.

FIG. 3 is a plan view of an acoustic wave device in accordance with a variation of the first embodiment. As illustrated in FIG. 3, in an acoustic wave device 102, the second wiring lines 26a and 26b are formed to be inclined with respect to the X direction and the Y direction. A first end of the second wiring line 26a connects to the mid-position of the first wiring line 24b in the Y direction, and a first end of the second wiring line 26b connects to the mid-position of the first wiring line 24a in the Y direction. A second end of the second wiring line 26a connects to the wiring line 24c connected to the parallel acoustic wave resonator P3 located outside the resonators S1 through S3 in the +Y direction. A second end of the second wiring line 26b connects to the wiring line 24d connected to the parallel acoustic wave resonator P2. Other configurations are the same as those of the first embodiment, and the description thereof is omitted.

The variation of the first embodiment can reduce the substantive transmission distance of signals in a wiring line that transmits the signal between the series acoustic wave resonators S1 and S2 to the parallel acoustic wave resonators P2, and/or a wiring ling that transmits the signal between the series acoustic wave resonators S2 and S3 to the parallel acoustic wave resonator P3. Thus, the substantive resistance component to these signals can be reduced. The term "mid-position" does not mean the "middle" in the narrow sense, and means a position between ends in the broad sense.

Second Embodiment

Figure 4:
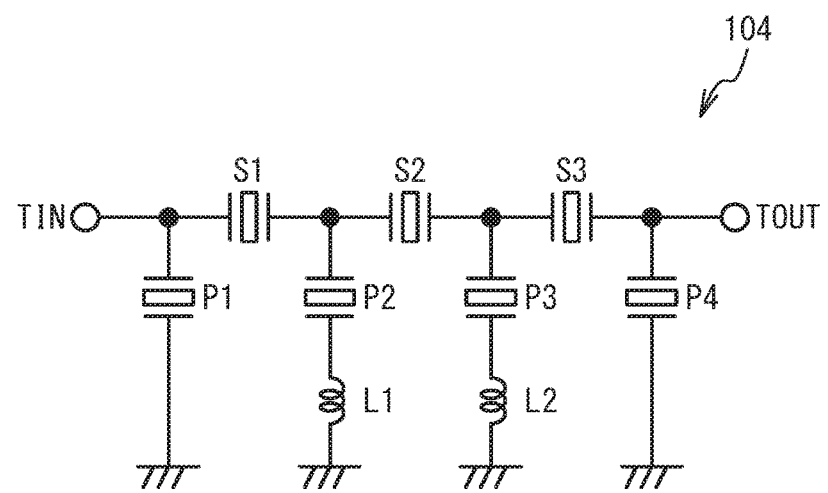
FIG. 4 is a circuit diagram of an acoustic wave device in accordance with a second embodiment.

FIG. 4 is a circuit diagram of an acoustic wave device in accordance with a second embodiment. As illustrated in FIG. 4, in an acoustic wave device 104, the series acoustic wave resonators S1 through S3 are connected in series between the input terminal TIN and the output terminal TOUT. The parallel acoustic wave resonators P1 through P4 are connected in parallel between the input terminal TIN and the output terminal TOUT. An inductor L1 is connected between the parallel acoustic wave resonator P2 and a ground, and an inductor L2 is connected between the parallel acoustic wave resonator P3 and a ground. The inductors L1 and L2 widen the band of a ladder-type filter and decrease the loss of the ladder-type filter.

Figure 5A:
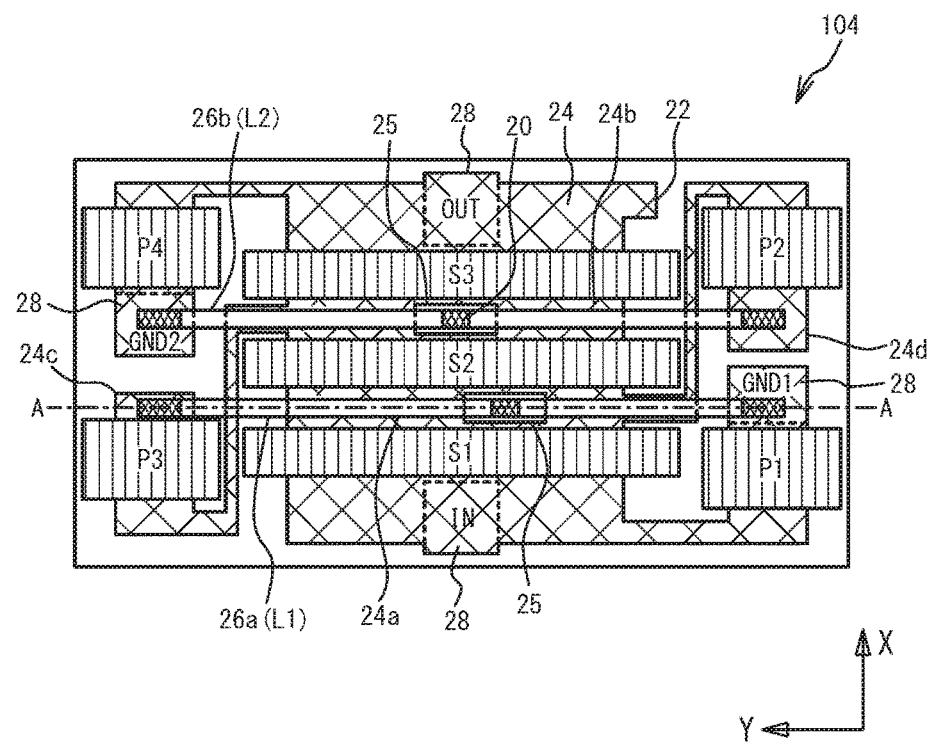
FIG. 5A is a plan view of the acoustic wave device of the second embodiment.
Figure 5B:
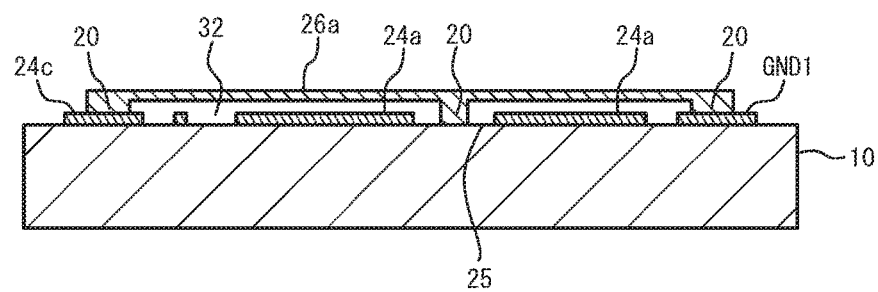
FIG. 5B is a cross-sectional view taken along line A-A in FIG. 5A.

FIG. 5A is a plan view of the acoustic wave device of the second embodiment, and FIG. 5B is a cross-sectional view taken along line A-A in FIG. 5A. As illustrated in FIG. 5A and FIG. 5B, the inductor L1 is formed of the second wiring line 26a, and the inductor L2 is formed of the second wiring line 26b. The second wiring line 26a connects the first wiring line 24c that is connected to a ground side end of the parallel acoustic wave resonator P3 to a ground electrode GND1. The second wiring line 26b connects the first wiring line 24d that is connected to a ground side end of the parallel acoustic wave resonator P2 to a ground electrode GND2. The second wiring line 26a is located immediately above the first wiring line 24a across the air gap 32, and the second wiring line 26b is located immediately above the first wiring line 24b across the air gap 32. The supporting posts 20 that support the second wiring lines 26a and 26b are located at mid-positions other than both ends of the second wiring lines 26a and 26b. The supporting posts 20 are formed in apertures 25 of the first wiring lines 24a and 24b. This structure electrically separates the supporting posts 20 from the first wiring lines 24a and 24b. Other configurations are the same as those of the first embodiment, and thus the description thereof s omitted.

As described in the second embodiment, the second wiring lines 26a and 26b can be used as the inductors L1 and L2. When the second wiring lines 26a and 26b are long, the supporting posts 20 that support the second wiring lines 26a and 26b are located at mid-positions other than both ends of the second wiring lines 26a and 26b. That is to say, provided are the supporting posts 20 (first supporting posts) that support the second wiring lines 26a and 26b at both ends of the second wiring lines 26a and 26b and the supporting posts 20 (second supporting posts) that support the second wiring line 26a and 26b at other than both ends of the second wiring lines 26a and 26b. This structure increases the mechanical strengths of the second wiring lines 26a and 26b. The supporting posts 20 located at both ends of the second wiring lines 26a and 26b aim to electrically connect the second wiring lines 26a and 26b to the first wiring line 24 and/or the pad 28. The supporting posts 20 located at mid-positions other than both ends of the second wiring lines 26a and 26b do not aim the electrical connection. Thus, the supporting post 20 located at a mid-position does not connect to the first wiring line 24 or the pad 28, and connects to the substrate 10 or to the insulating film formed on the substrate 10.

The second wiring line 26a is formed to connect the first wiring line 24c at the ground side of the parallel acoustic wave resonator P3 that is located in the +Y direction with respect to the region where the series acoustic wave resonators S1 through S3 are formed to the ground electrode GND1 that is located in the −Y direction with respect to the region in FIG. 5A. The second wiring line 26b is formed to connect the ground electrode GND2 that is located in the +Y direction with respect to the region where the series acoustic wave resonators S1 through S3 are arranged to the first wiring line 24d at the ground side of the resonator P2 that is located in the −Y direction with respect to the region in FIG. 5A. As described above, the second wiring lines 26a and 26b are formed immediately above the first wiring lines 24a and 24b across the air gaps 32 so as to connect both sides outside the region where the series acoustic wave resonators S1 through S3 are formed in the ±Y direction. This structure allows the long second wiring lines 26a and 26b such as the inductors L1 and L2 to be arranged without using the region making contact with the substrate. Thus, the size of the acoustic wave device can be reduced. The second wiring lines 26a and 26b may be formed immediately above the series acoustic wave resonators S1 through S3 across the air gap 32.

Third Embodiment

Figure 6:
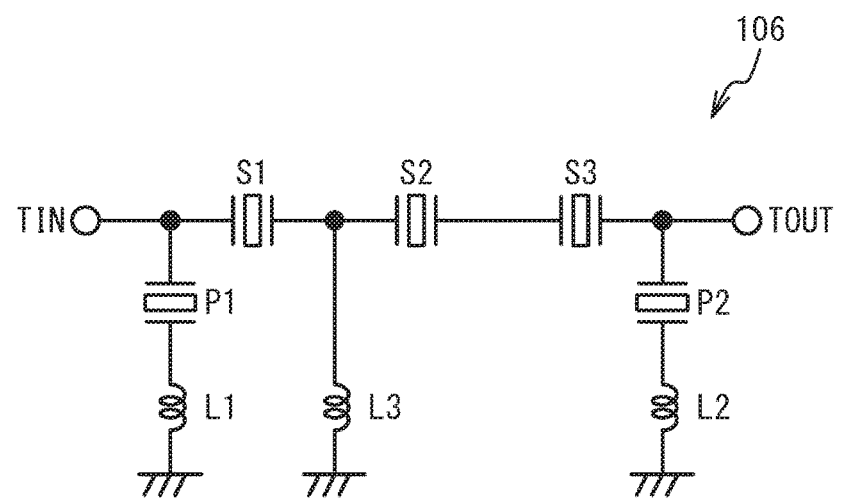
FIG. 6 is a circuit diagram of an acoustic wave device in accordance with a third embodiment.

FIG. 6 is a circuit diagram of an acoustic wave device in accordance with a third embodiment. As illustrated in FIG. 6, in an acoustic wave device 106, the series acoustic wave resonators S1 through S3 are connected in series between the input terminal TIN and the output terminal TOUT. The parallel acoustic wave resonators P1 and P2 are connected in parallel between the input terminal TIN and the output terminal TOUT. The inductor L is connected between the parallel acoustic wave resonator P1 and a ground, and the inductor L2 is connected between the parallel acoustic wave resonator P2 and a ground. An inductor L3 is connected between a node between the series acoustic wave resonators S1 and S2 and a ground.

Figure 7A:
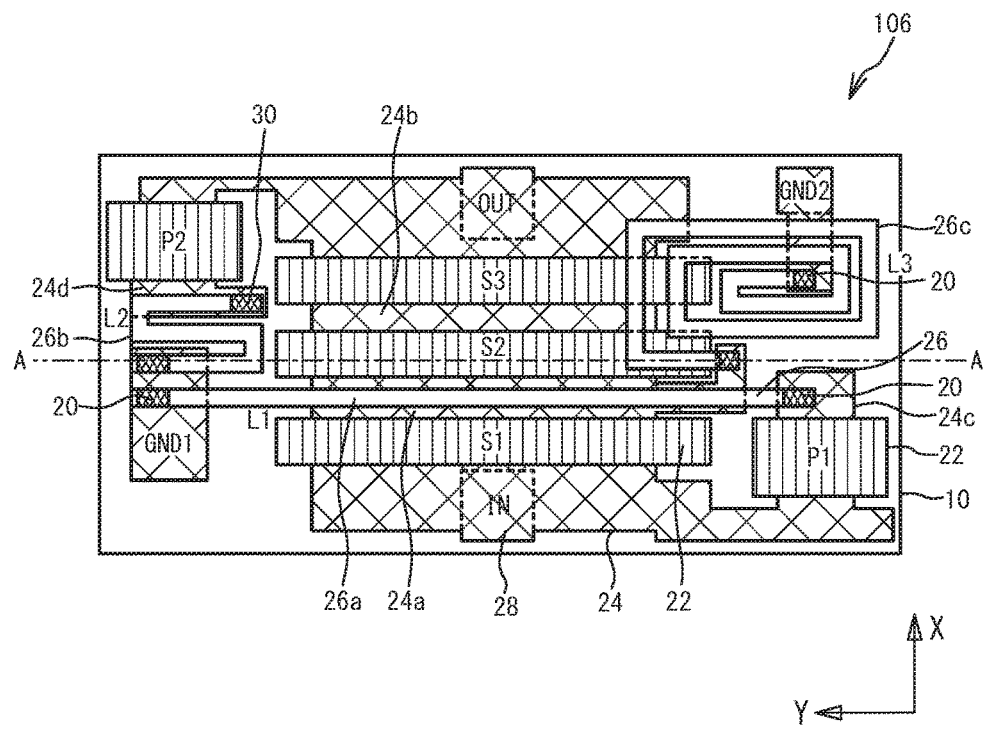
FIG. 7A is a plan view of the acoustic wave device of the third embodiment.
Figure 7B:
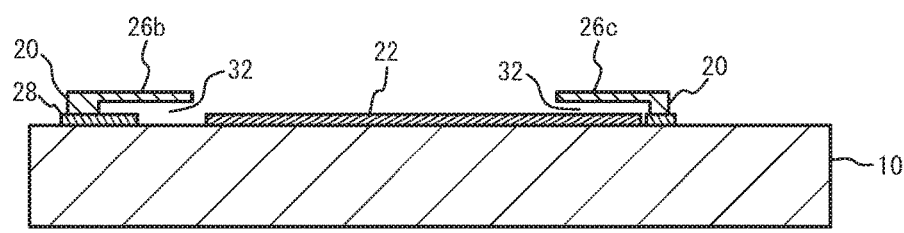
FIG. 7B is a cross-sectional view taken along line A-A in FIG. 7A.

FIG. 7A is a plan view of the acoustic wave device of the third embodiment, and FIG. 7B is a cross-sectional view taken along line A-A in FIG. 7A. As illustrated in FIG. 7A and FIG. 7B, the inductors L1 through L3 are formed of the second wiring lines 26a through 26c, respectively. The second wiring line 26a connects the first wiring line 24c that is connected to a ground side end of the parallel acoustic wave resonator P1 to the ground electrode GND1. The second wiring line 26a is located immediately above the first wiring line 24a across the air gap 32. The second wiring line 26b connects the first wiring line 24d that is connected to a ground side end of the parallel acoustic wave resonator P2 to the ground electrode GND1. The second wiring line 26b is in a meander shape. The second wiring line 26c connects the first wiring line 24a to the ground terminal GND2. The second wiring line 26c is in a coiled shape (a spiral shape), and a part thereof is located immediately above the series acoustic wave resonators S2 and S3 and the first wiring line 24b across the air gap 32. Other configurations are the same as those of the first embodiment, and the description thereof is omitted.

As described in the third embodiment, the second wiring lines 26b and 26c can be in a meander shape or in a coiled shape. This configuration enables to form an inductor with large inductance.

Fourth Embodiment

Figure 8A:
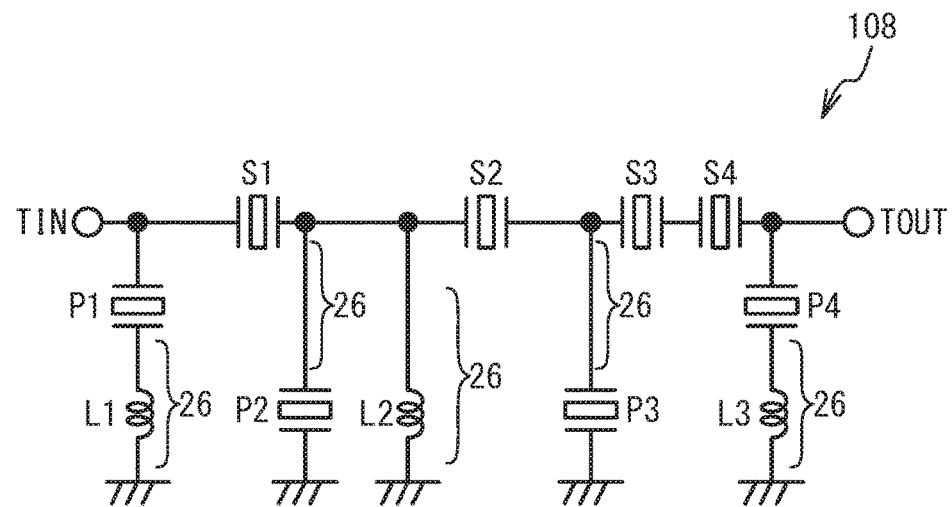
FIG. 8A and FIG. 8B are circuit diagrams of acoustic wave devices in accordance with a fourth embodiment.
Figure 8B:
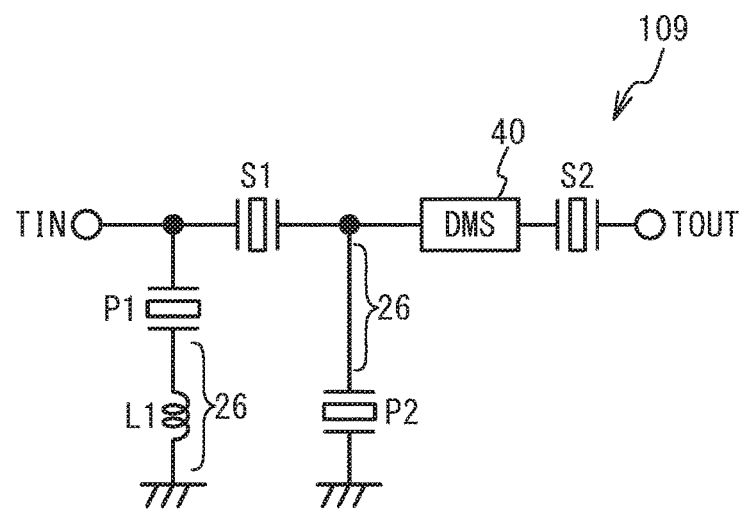

FIG. 8A through FIG. 8B are circuit diagrams of acoustic wave devices in accordance with a fourth embodiment. As illustrated in FIG. 8A, an acoustic wave device 108 is a ladder-type filter. The series acoustic wave resonators S1 through S4 are connected in series between the input terminal TIN and the output terminal TOUT. The parallel acoustic wave resonators P1 through P4 are connected in parallel between the input terminal TIN and the output terminal TOUT. The inductor L1 is connected between the parallel acoustic wave resonator P1 and a ground, and the inductor L3 is connected between the parallel acoustic wave resonator P4 and a ground. The inductor L2 is connected between a node between the series acoustic wave resonators S1 and S2 and a ground. The wiring line between a node between the series acoustic wave resonators S1 and S2 and the parallel acoustic wave resonator P2, the wiring line between a node between the series acoustic wave resonators S2 and S3 and the parallel acoustic wave resonator P3, and the inductors L1 through L3 are formed of the second wiring line 26.

As illustrated in FIG. 8B, an acoustic wave device 109 is a filter including a ladder-type filter and a DMS (double mode surface acoustic wave) filter. The series acoustic wave resonators S1 and S2 are connected in series between the input terminal TIN and the output terminal TOUT. The parallel acoustic wave resonators P1 and P2 are connected in parallel between the input terminal TIN and the output terminal TOUT. A DMS filter 40 is connected between the series acoustic wave resonators S1 and S2. The inductor L1 is connected between the parallel acoustic wave resonator P1 and a ground. The wiring line between a node between the series acoustic wave resonator Si and the DMS filter 40 and the parallel acoustic wave resonator P2, and the inductor L1 are formed of the second wiring line 26.

As described in the fourth embodiment, at least one or more of the inductors L1 through L3 can be formed with use of the second wiring line 26. The wiring line interconnecting the acoustic wave resonators can be formed with use of the second wiring line 26. The second wiring line 26 can be applied to a filter including the DMS filter 40. In the fourth embodiment, a part of the path of the parallel arm of the ladder-type filter is formed by using the second wiring line 26. The second wiring line 26 may form the path of the series arm of the ladder-type filter. For example, a wiring line interconnecting the series acoustic wave resonators may be the second wiring line 26. An inductor connected in parallel to a series acoustic wave resonator may be the second wiring line 26. The second wiring line 26 may be formed immediately above a resonator so as to overpass a series acoustic wave resonator and/or a parallel acoustic wave resonator.

Fifth Embodiment

Figure 9A:
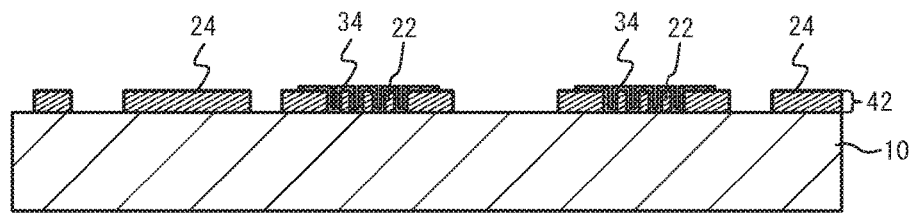
FIG. 9A through FIG. 9D are cross-sectional views illustrating a method of fabricating an acoustic wave device in accordance with a fifth embodiment (No. 1)

A fifth embodiment is an exemplary fabrication method of the acoustic wave devices of the first through fourth embodiments and the variation thereof. FIG. 9A through FIG. 10B are cross-sectional views illustrating a method of fabricating an acoustic wave device in accordance with the fifth embodiment. The circuit diagram and the plan view of the acoustic wave device fabricated by the fifth embodiment are not illustrated, but the fifth embodiment is an acoustic wave device in which the second wiring line 26 is formed so as to overpass two acoustic wave resonators 22 by using the supporting posts 20 located at both ends and the supporting post 20 located at other than both ends. The acoustic wave devices of the first through fourth embodiments and the variations thereof can be fabricated by the same or similar method. As illustrated in FIG. 9A, a metal film 42 is formed on the substrate 10. The substrate 10 is, for example, a piezoelectric substrate such as a lithium tantalate substrate or a lithium niobate substrate. The metal film 42 is, for example, an aluminum film. The metal film 42 is formed by, for example, sputtering and etching. The metal film 42 forms the acoustic wave resonators 22 and the first wiring lines 24. The metal film 42 has a film thickness of, for example, 150 to 400 nm. The metal film 42 may be a copper film or the like. A protective film 34 is formed on the acoustic wave resonators 22. The protective film 34 is, for example, a silicon oxide film with a film thickness of 20 nm. The protective film 34 is formed by, for example, sputtering and etching.

Figure 9B:
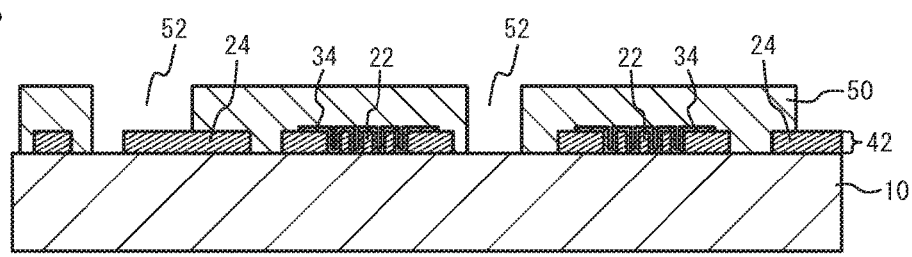

As illustrated in FIG. 9B, a mask layer 50 is formed on the substrate 10 so that apertures 52 are formed in regions where the supporting posts 20 are formed. The apertures 52 are formed in a part on the substrate 10, and in a part of the first wiring line 24. The mask layer 50 has heat resistance satisfactory for baking performed later, and is, for example, a photoresist film with a film thickness of 2 μm or greater. The mask layer 50 is formed by, for example, photolithography.

Figure 9C:
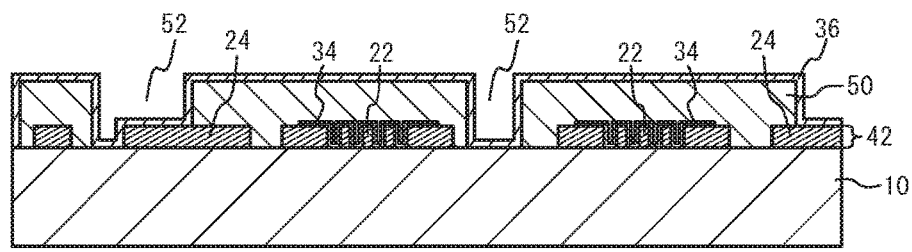

As illustrated in FIG. 9C, a seed layer 36 is formed across the entire surface on the substrate 10 so as to cover the mask layer 50. The seed layer 36 is, for example, a titanium film with a film thickness of 0.2 μm and a gold film with a film thickness of 0.15 μm stacked in this order from the substrate 10 side. The seed layer 36 is formed by, for example, evaporation. The seed layer 36 may be a titanium film with a film thickness of 0.1 μm and a copper film with a film thickness of 0.3 μm stacked in this order from the substrate 10 side. The seed layer 36 may be formed by sputtering, but is preferably formed by evaporation because liftoff is performed later. The substrate 10 side film of the seed layer 36 is an adhesion film that improves the adhesiveness with the metal film 42. When the metal film 42 is an aluminum film, the adhesion film is, for example, a titanium film. The upper side film of the seed layer 36 functions as a seed for plating, and is preferably made of the same material as the plated layer.

Figure 9D:
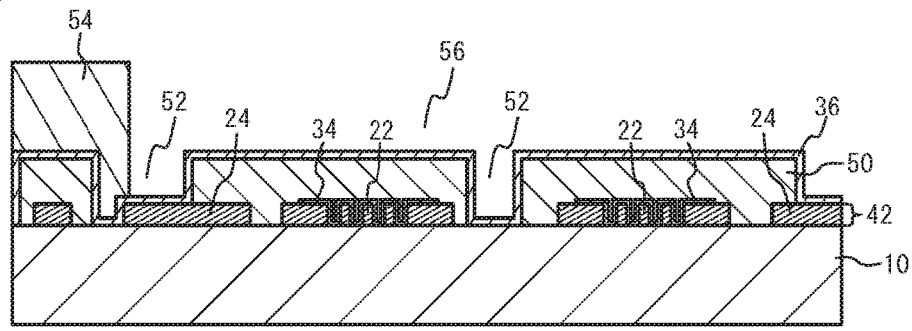

As illustrated in FIG. 9D, a mask layer 54 is formed on the seed layer 36 so that an aperture 56 is formed in a region where the second wiring line 26 is formed. The mask layer 54 is, for example, a photoresist film with a film thickness of 7 μm. The mask layer 54 is formed by, for example, photolithography.

Figure 10A:
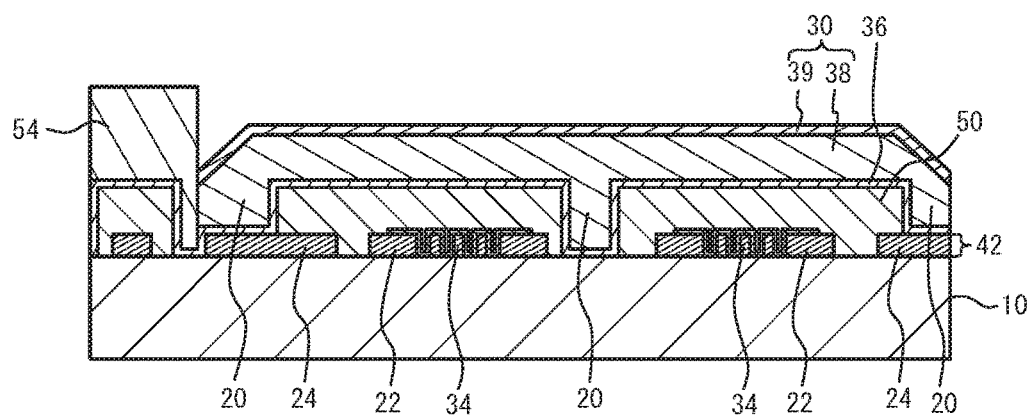
FIG. 10A and FIG. 10B are cross-sectional views illustrating the method of fabricating the acoustic wave device of the fifth embodiment (No. 2).

As illustrated in FIG. 10A, a plated layer 30 is formed in the aperture 56. The plated layer 30 includes a lower layer 38, a barrier layer (not illustrated), and an upper layer 39 in this order from the substrate 10 side. The lower layer 38 is, for example, a copper layer with a film thickness of 3 μm. The barrier layer is, for example, a palladium layer with a film thickness of 0.3 μm. The upper layer 39 is, for example, a gold layer with a film thickness of 1 μm. The plated layer 30 is formed by electrolytic plating by supplying electrical current from the seed layer 36. The lower layer 38 is preferably made of a non-magnetic material of low electrical resistivity capable of being thickened. Thus, the lower layer 38 is preferably a copper layer or a gold layer. The film thickness of the lower layer 38 is preferably, for example, 1 μm or greater to reduce the resistance of the second wiring line 26. When a stud bump is formed on the plated layer 30, the upper layer 39 is preferably a gold layer. The barrier layer reduces the interdiffusion between the lower layer 38 and the upper layer 39 due to the heating or the temporal change. When the lower layer 38 is a copper layer, and the upper layer 39 is a gold layer, the barrier layer is preferably a palladium layer or a nickel layer with a film thickness of approximate 0.2 μm. The upper layer 39 may be formed by electroless plating. In this case, the film thickness of the upper layer 39 is, for example, 0.4 μm. The barrier layer and the upper layer 39 may be formed by evaporation. In this case, the barrier layer is, for example, a titanium layer with a film thickness of 0.2 μm, and the upper layer 39 is a gold layer with a film thickness of 0.4 μm.

Figure 10B:
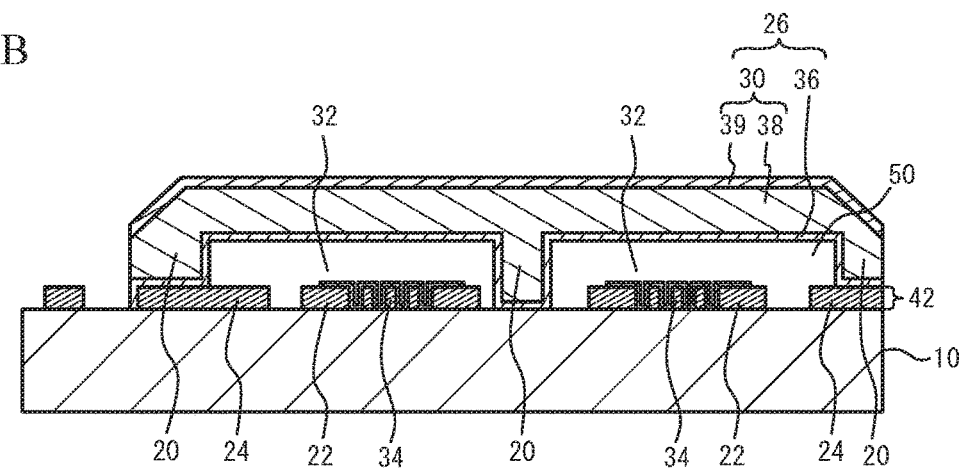

As illustrated in FIG. 10B, the mask layers 50 and 54 are removed by using, for example, an organic solvent. At this time, the seed layer 36 formed between the mask layers 50 and 54 is liftoff. To liftoff the seed layer 36, the organic solvent may be injected at high pressure. Alternatively, ultrasonic cleaning in the organic solvent may be performed. The seed layer 36 and the plated layer form the second wiring line 26 and the supporting posts 20.

As described in the fifth embodiment, as illustrated in FIG. 9A, the metal film 42 is formed in regions to become the acoustic wave resonator 22 and the first wiring line 24 on the substrate 10. As illustrated in FIG. 9B, the mask layer 50 having the apertures 52 above the regions to become the supporting posts 20 is formed. As illustrated in FIG. 9C, the seed layer 36 is formed so as to make contact with the metal film 42 in the apertures 52 and to cover the mask layer 50. As illustrated in FIG. 9D, on the seed layer 36, formed is the mask layer 54 having the aperture 56 in the region to become the second wiring line 26. As illustrated in FIG. 10A, the plated layer 30 is formed on the seed layer 36 in the aperture 56 by supplying electrical current from the seed layer 36. As illustrated in FIG. 10B, the mask layer 50 and the mask layer 54 are removed to liftoff the seed layer 36 other than the seed layer 36 in the apertures 52. This process forms the second wiring line 26 above the acoustic wave resonator 22 and the first wiring line 24 across the air gap 32.

The first wiring line 24 includes the metal film 42, and does not include the seed layer 36 or the plated layer 30. The second wiring line 26 does not include the metal layer, and includes the seed layer 36 and the plated layer 30. The first wiring line 24 in a region other than the region intersecting the second wiring line 26 may include the seed layer 36 and the plated layer 30. The second wiring line 26 can be thickened by including the plated layer 30. For example, the film thickness of the second wiring line 26 can be thickened to 3 μm or greater. This enables to reduce the resistance of the second wiring line 26. Thereby, the loss of the acoustic wave device can be reduced.

The first through fifth embodiments and the variations thereof use a surface acoustic wave device as the example of the acoustic wave resonator 22, but the acoustic wave resonator 22 may be a boundary acoustic wave resonator, a Love wave resonator, or a piezoelectric thin film resonator.

Although the embodiments of the present invention have been described in detail, it is to be understood that the various change, substitutions, and alterations could be made hereto without departing from the spirit and scope of the invention.

What is claimed is:

1. An acoustic wave device comprising:
a substrate;
a plurality of acoustic wave resonators that are formed on an upper surface of the substrate;
a first wiring line that is formed on the upper surface of the substrate and is electrically coupled to at least one of the plurality of acoustic wave resonators; and
one or more second wiring lines that are electrically coupled to the first wiring line and connects regions located on the upper surface of the substrate, at least a part of the one or more second wiring lines being formed immediately above one or more of the plurality of acoustic wave resonators across an air gap,
wherein the one or more second wiring lines are not supported by any other substrate other than the substrate, and
each of the one or more of the plurality of acoustic wave resonators includes a first region overlapping with the one or more second wiring lines in a plan view and a second region not overlapping with the one or more second wiring lines in the plan view.

2. The acoustic wave device according to claim 1, further comprising:
a pair of first supporting posts that is formed on the substrate, and supports at least one of the one or more second wiring lines at both ends of the at least one of the one or more second wiring lines; and
a second supporting post that supports the at least one of the one or more second wiring lines at other than the both ends of the at least one of the one or more second wiring lines.

3. The acoustic wave device according to claim 1, wherein at least one of the one or more second wiring lines is in a coiled shape or in a meander shape.

4. The acoustic wave device according to claim 1, wherein the plurality of the acoustic wave resonators are arranged in a first direction on the substrate,
the first wiring line is formed between adjacent acoustic wave resonators of the plurality of the acoustic wave resonators, and electrically connects the adjacent acoustic wave resonators, and
at least one of the one or more second wiring lines is formed immediately above at least one acoustic wave resonator of the plurality of acoustic wave resonators across the air gap.

5. The acoustic wave device according to claim 4, wherein a first end of the at least one of the one or more second wiring lines is coupled to a mid-position of the first wiring line in a second direction intersecting the first direction.

6. The acoustic wave device according to claim 4, further comprising another acoustic wave resonator that is formed on the upper surface of the substrate, said another acoustic wave resonator being arranged outside the plurality of acoustic wave resonators in a second direction intersecting with the first direction,
wherein
a second end of the at least one of the one or more second wiring lines is coupled to said another acoustic wave resonator.

7. The acoustic wave device according to claim 4, further comprising:
one or more parallel acoustic wave resonators that are connected in parallel between an input electrode and an output electrode and are formed outside the plurality of acoustic wave resonators in a second direction intersecting the first direction on the substrate,
wherein the plurality of acoustic wave resonators are series acoustic wave resonators connected in series between the input electrode and the output electrode, and
the at least one of the one or more second wiring lines connects the first wiring line to at least one of the one or more parallel acoustic wave resonators.

8. The acoustic wave device according to claim 4, wherein the at least one of the one or more second wiring lines connects the first wiring line to a region located outside the plurality of acoustic wave resonators in a second direction intersecting the first direction.

9. The acoustic wave device according to claim 1, further comprising:
a supporting post that is formed on the upper face of the substrate and supports at least one of the one or more second wiring lines at both ends of the at least one of the one or more second wiring lines, wherein the at least one of the one or more second wiring lines is supported by only the supporting post.

10. An acoustic wave device comprising:

a substrate;

a plurality of acoustic wave resonators that are formed to be arranged in a first direction on the substrate;

a first wiring line that is formed between the plurality of acoustic wave resonators on the substrate, and connects adjacent acoustic wave resonators of the plurality of acoustic wave resonators; and one or more second wiring lines that are formed immediately above the first wiring line or above a part of one or more of the plurality of acoustic wave resonators, or are formed immediately above both the first wiring line and one or more of the plurality of acoustic wave resonators, across an air gap so as to connect both sides outside the plurality of acoustic wave resonators in a second direction intersecting the first direction wherein the one or more second wiring lines are not supported by any other substrate other than the substrate, and each of the one or more of the plurality of acoustic wave resonators includes a first region overlapping with the one or more second wiring lines in a plan view and a second region not overlapping with the one or more second wiring lines in the plan view when the one or more second wiring lines are formed immediately above the part of the one or more of the plurality of acoustic wave resonators.

11. An acoustic wave device comprising:

a substrate;

series acoustic wave resonators formed on an upper surface of the substrate, the series acoustic wave resonators being connected in series between an input electrode and an output electrode and being arranged in a first direction on the substrate;

one or more parallel acoustic wave resonators that are formed on the upper surface of the substrate outside the series acoustic wave resonators in a second direction intersecting the first direction, the one or more parallel acoustic wave resonators being connected in parallel between the input electrode and the output electrode;

a first wiring line that is formed on the upper surface of the substrate between adjacent series acoustic wave resonators of the series acoustic wave resonators, the first wiring line electrically connecting the adjacent series acoustic wave resonators;

a ground electrode that is formed on the upper surface of the substrate; and a second wiring line that connects at least one of the one or more parallel acoustic wave resonators to the ground electrode, at least a part of the second wiring line being formed immediately above the first wiring line or above one or more of the series acoustic wave resonators, or being formed immediately above both the first wiring line and one or more of the series acoustic wave resonators, across an air gap.

* * * * *